United States Patent [19]
Lin et al.

[11] Patent Number: 5,742,542
[45] Date of Patent: Apr. 21, 1998

[54] NON-VOLATILE MEMORY CELLS USING ONLY POSITIVE CHARGE TO STORE DATA

[75] Inventors: Jonathan Lin, Milpitas; Stewart Logie, Campbell, both of Calif.

[73] Assignee: Advanced Micro Devices, Inc., Sunnyvale, Calif.

[21] Appl. No.: 497,992

[22] Filed: Jul. 3, 1995

[51] Int. Cl.⁶ .................. G11C 16/04; H01L 29/78
[52] U.S. Cl. .................. 365/185.08; 365/185.1; 257/318; 257/321
[58] Field of Search ............... 365/185.08, 185.26, 365/185.29, 185.1; 257/300, 315, 316, 318, 319, 321, 322

[56] References Cited

U.S. PATENT DOCUMENTS

| | | | |
|---|---|---|---|
| 4,616,245 | 10/1986 | Topich | 365/185.08 |
| 4,813,018 | 3/1989 | Kobayashi | 365/185.08 |
| 4,912,534 | 3/1990 | Tanaka | 365/185.01 |
| 4,924,278 | 5/1990 | Logie | 257/318 |
| 5,005,155 | 4/1991 | Radjy | 365/185.17 |
| 5,170,373 | 12/1992 | Doyle | 365/185.17 |
| 5,331,590 | 7/1994 | Josephson | 257/315 |

*Primary Examiner*—Viet Q. Nguyen
*Assistant Examiner*—Son Mai
*Attorney, Agent, or Firm*—Davis Chin

[57] ABSTRACT

An improved EEPROM structure is provided which has a longer data retention period. This is achieved by utilizing only positive charges to store data on the floating gate. The EEPROM structure includes a write select transistor (112), a read select transistor (120), and a floating gate sense transistor (126). The source of the write select transistor is capacitively coupled to the floating gate of the floating gate sense transistor via a tunnel oxide layer (145). The floating gate of the floating gate sense transistor is also capacitively coupled to a control gate line (CG) via a gate oxide layer (153). The sense transistor is formed as an enhancement transistor so as to allow the EEPROM structure to be operated in a region where the floating gate potential is positive for both programmed and erased conditions, thereby using only the positive charges to store data.

16 Claims, 4 Drawing Sheets

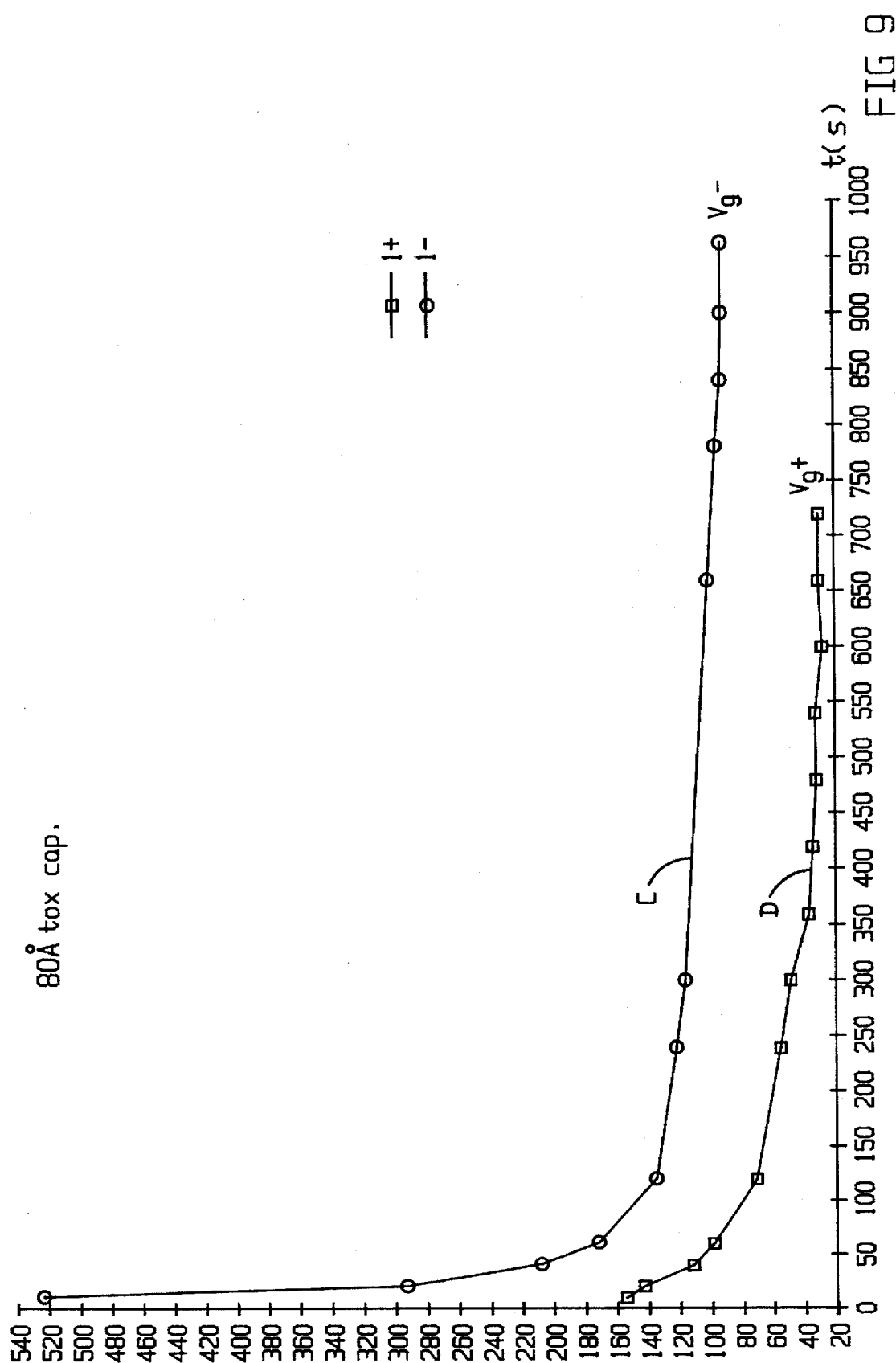

NON-VOLATILE MEMORY CELLS USING ONLY POSITIVE CHARGE TO STORE DATA

BACKGROUND OF THE INVENTION

This invention relates generally to electrical erasable programmable read-only memory (EEPROM) devices for use in programmable logic devices and more particularly, it relates to an improved EEPROM structure which utilizes only positive charge to store data so as to prevent degradation of data retention during scaling down.

As is generally known in the art, there has been developed in recent years in the area of non-volatile memory devices an electrical erasable programmable read-only memory (EEPROM) device having a floating gate referred to as "flash EEPROM" which has emerged as an important memory device by combining the advantages of EPROM density with EEPROM electrical erasability. The flash EEPROM device allows its programmed contents to be electrically erased so as to permit its reprogramming. The EEPROM device can be electrically erased within typically ten milliseconds which is different from the conventional EPROM devices that are erased in bulk by exposure to ultra-violet lights. The EEPROM device includes a single transistor having a source and a drain formed in a silicon substrate. The source and drain are separated from each other by a channel region. A gate insulation layer electrically insulates a polycrystalline silicon floating gate from the channel region and the drain. A very thin tunnel oxide region electrically insulates a small portion of the floating gate from the drain. An insulative layer is formed between the floating gate and a control gate.

In "flash" memory terminology, the EEPROM device has electrons added or injected into the floating gate in order to program a logic "0." This is achieved by the charging of the floating gate with electrons. In order to erase to a logic "1" in the EEPROM device, electrons are removed from the floating gate. This is achieved by the discharging of the electrons from the floating gate.

These EEPROM devices have also been found to be particularly advantageous for use in programmable logic devices which are often called electrical erasable and programmable logic devices (EEPLD). As is generally known, a typical programmable logic device includes a plurality of input terms feeding a programmable AND array whose output is then fed to either a fixed or programmable OR array. The outputs of the AND array constitutes product terms, and the array is programmable to select which of the input terms are ANDed together to form each of the product terms. In EEPLD terminology, the charging of the floating gate (adding electrons) is referred to as "erase" and the discharging of the floating gate (removing electrons) is referred to as "programming." It will be noted that this is opposite to the definitions of erase and programming in "flash" memory terminology.

As is also generally well-known, all electrically erasable devices which store electrons on a floating gate suffer from potential loss of electrons over a long period of time due to the undesired tunneling through the tunnel dielectric. The manufacturers of the floating gate devices generally specify data retention limits at ten (10) years. This problem of data retention is much more severe for an EEPLD than for an EEPROM since they are re-programmed much less frequently than the electrical erasable programmable read-only memory cells. Due to the fact that the data retention period starts anew each time the device is re-programmed, the end of the lifetime specified for the EEPROM will be much less likely to be important than for the EEPLD.

In view of recent research conducted by the inventors, it has been determined that data retention utilizing the storage of electrons (negative charge) on the floating gate degrades sharply when the thickness of the tunnel oxide is scaled down, but that data retention which uses the storage of positive charge remains very stable. Therefore, it would be desirable to provide an improved EEPROM structure which uses only positive charge in order to store data or information since it does not degrade data retention during scaling down.

In U.S. Pat. No. 4,924,278 to Stewart Logie issued on May 8, 1990, and assigned to the same assignee as the present invention, there is disclosed an EEPROM structure utilizing a single layer of polycrystalline silicon so as to eliminate the need to form a separate control gate and a floating gate. This '278 patent is hereby incorporated by reference in its entirety. The EEPROM structure is made up of three separate NMOS transistors, namely a write transistor, a read transistor, and a sense transistor. In order to program the floating gate, the floating gate is given a positive charge by removing free electrons from the floating gate. On the other hand, when it is desired to erase the floating gate it is given a net negative charge by injecting of electrons onto the floating gate. This EEPROM structure suffers from the problem of data retention since it uses both the positive charge during programming and the negative charge during erase. As a result, its data retention is reduced over its lifetime.

The present invention represents a significant improvement over the aforementioned '278 patent so as to provide an improved EEPROM structure which has a longer data retention period. This is achieved by utilizing only positive charge in order to store data on the floating gate.

SUMMARY OF THE INVENTION

Accordingly, it is a general object of the present invention to provide an improved EEPROM structure which overcomes the disadvantages of the prior art memory cells.

It is an object of the present invention to provide an improved EEPROM structure which utilizes only positive charge to store data so as to prevent degradation of data retention during scaling down.

It is another object of the present invention to provide an improved EEPROM structure for use in programmable logic arrays which has a longer data retention period than is traditionally available.

According to one aspect of the present invention, there is provided a non-volatile memory cell which is comprised of a write select transistor, a read select transistor, and a floating gate sense transistor. The drain of the write select transistor is connected to a write control line. The control gate of the write select transistor is connected to the control gate of the read select transistor and to a word line. The source of the write select transistor is capacitively coupled to the gate of the floating gate sense transistor via a tunnel oxide layer.

The drain of the read select transistor is connected to a product term line, and the source of the read select transistor is connected to the drain of the floating gate sense transistor. The floating gate of the floating gate sense transistor is capacitively coupled to a control gate line via a gate oxide layer, and the source of the floating gate sense transistor is connected to a product term ground line.

In another aspect of the present invention, there is provided an EEPROM structure which is used to form the non-volatile memory cell just described.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 9 is a graph of the low level leakage data, useful in understanding the data retention.

DESCRIPTION OF THE PREFERRED EMBODIMENT

Figure 1:
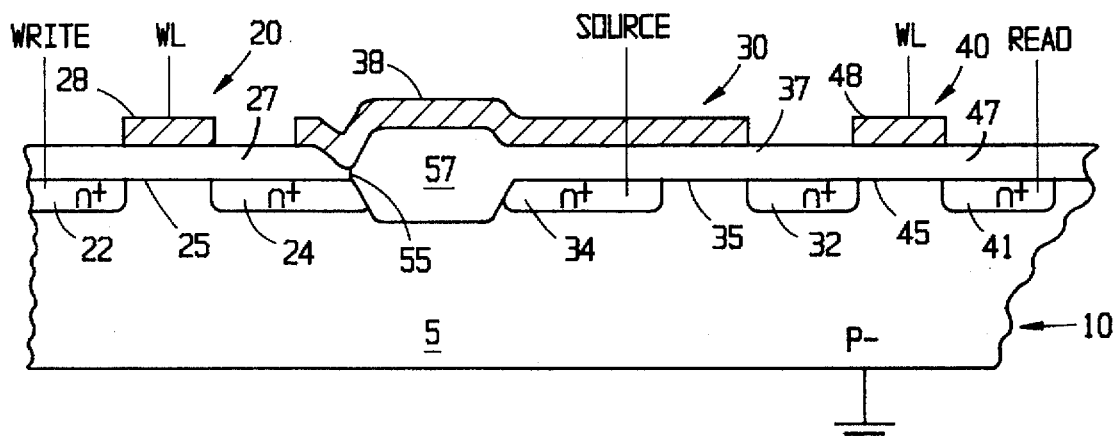
FIG. 1 is a cross-sectional view of a prior art EEPROM structure using a single poly-Si layer.

In FIG. 1, there is shown a cross-sectional view of the prior art EEPROM memory cell 10 of the '278 patent. The memory cell 10 includes a P-type substrate 5 which has N+ type regions 22, 24, 32, 34 and 41 formed on and below its surface by standard diffusion techniques. These N+ type regions correspond to the respective source and drain regions of the three transistors 20, 30 and 40 which make up the EEPROM memory cell. A schematic circuit diagram of the EEPROM memory cell is illustrated in FIG. 2 as the three separate transistors 20, 30 and 40.

The write transistor 20 is comprised of the drain 22, source 24, channel region 25, gate oxide layer 27 and control gate 28. The sense transistor 30 is comprised of the drain 32, source 34, channel region 35, oxide gate layer 37, and N type polycrystalline silicon (poly-Si) floating gate 38. The read transistor 40 is comprised of the drain 41, source 32 (drain of the sense transistor 30), channel region 45, gate oxide layer 47, and control gate 48.

The poly-Si floating gate 38 is capacitively coupled to the source 34 of the sense transistor 30 via the gate oxide layer 37, which is approximately 300 Å in thickness. The floating gate 38 is also capacitively coupled to the source 24 of the write transistor 20 via the tunnel oxide layer 55 which is approximately 90 Å in thickness. It will be noted that the floating gate 38 also extends over the channel region 35 of the sense transistor 30 so that when a sufficient positive charge is on the floating gate, the channel region 35 will invert and conduct current between the source 24 and the drain 32 of the sense transistor 30. The field oxide 57 is used to insulate the floating gate 38 from the underlying substrate 5 separating the sense transistor 30 and the write transistor 20.

Figure 2:
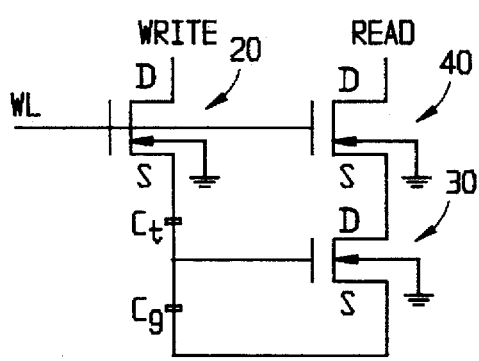
FIG. 2 is a schematic circuit diagram of the prior art EEPROM structure of FIG. 1.

In FIG. 2, the word line WL is connected to the control gates 28 and 48 of the respective write and read transistors 20, 40. The tunnel oxide layer 55 is represented by a capacitor $C_t$, and the gate oxide layer 37 between the source 34 of the sense transistor and the floating gate 38 is represented by a capacitor $C_g$. When the floating gate 38 is being programmed, the floating gate is given a net positive charge by removing free electrons from the floating gate. When the floating gate is being erased, the floating gate is given a net negative charge by adding electrons to the floating gate.

The EEPROM structure 10 in this '278 patent eliminates the use of a separate control gate above the floating gate since the floating gate is both capacitively coupled to the sources of the sense and write transistors. Consequently, the structure 10 enables a high coupling ratio during erase thereby allowing faster erase times by coupling a higher voltage onto the poly-Si floating gate. Nevertheless, the data retention is still reduced due to the use of both positive and negative charges. Further, there is no provision made for controlling a larger end-of-life window to allow for a greater design margin since the tunnel dielectric thickness is fixed.

Figure 5:
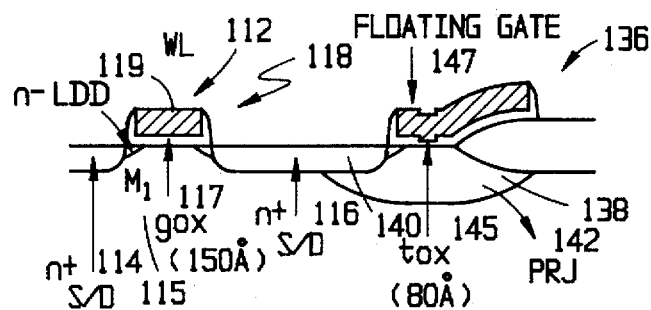
FIG. 5 is a cross-sectional view of the EEPROM structure, taken along the lines 5—5 of FIG. 3.
Figure 6:
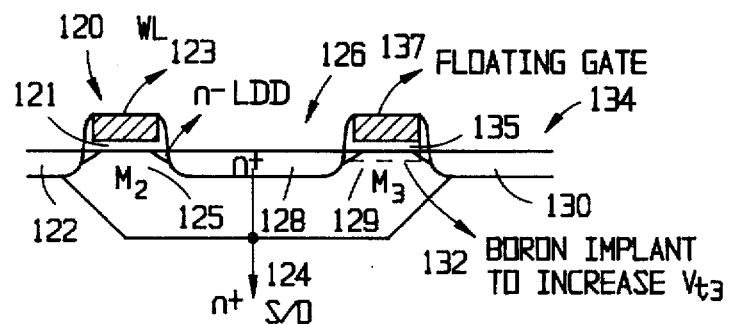
FIG. 6 is a cross-sectional view of the EEPROM structure, taken along the lines 6—6 of FIG. 3.
Figure 3:
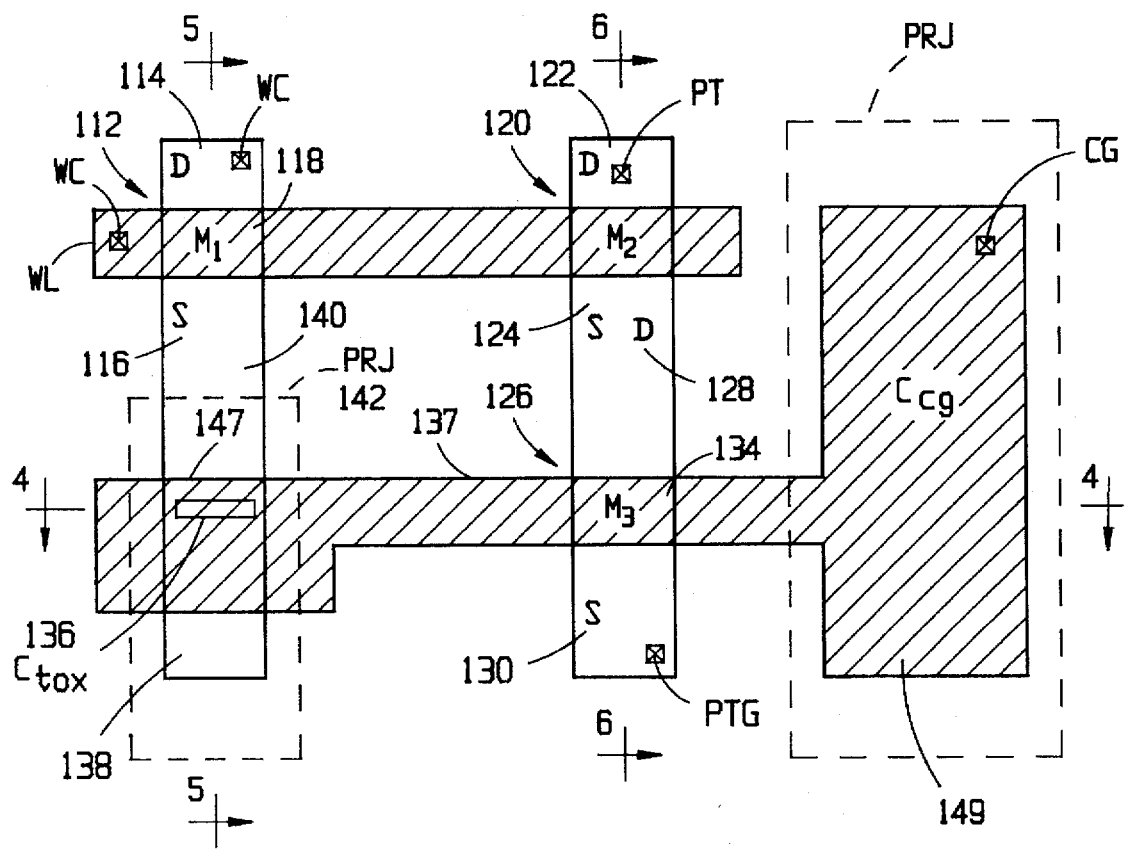
FIG. 3 is a top plan view of a layout for an EEPROM structure, constructed in accordance with the principles of the present invention.
Figure 4:
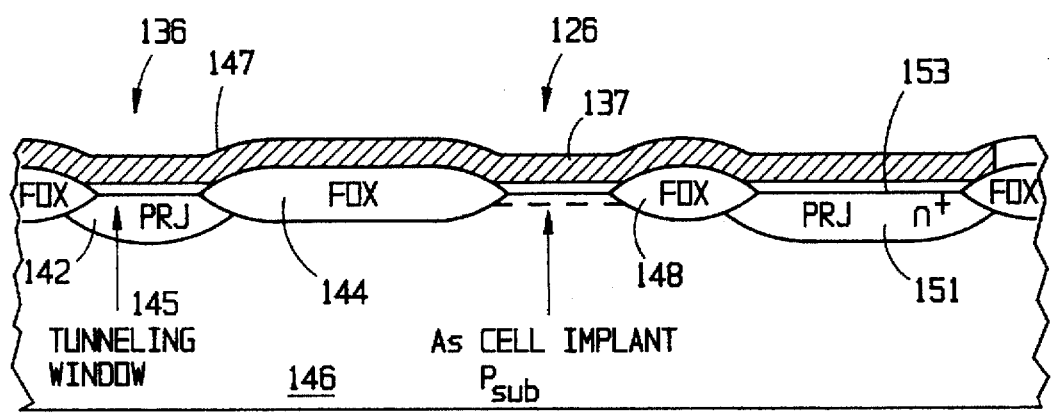
FIG. 4 is a cross-sectional view of the EEPROM structure, taken along the lines 4—4 of FIG. 3.

Referring now to FIG. 3 of the drawings, there is shown a top plan view of a layout for an EEPROM structure 110 constructed in accordance with the principles of the present invention. FIG. 4 is a cross-sectional view taken along the lines 4—4 of FIG. 3; FIG. 5 is cross-sectional view taken along the lines 5—5 of FIG. 3; and FIG. 6 is a cross-sectional view taken along the lines 6—6 of FIG. 3. As fabricated, a write select transistor 112 is formed with N+ drain region 114 and N+ source region 116, a channel region 115 under a write select gate structure 118 which is made of a poly-2 layer. The select gate structure 118 comprises a gate oxide layer 117 (approximately 150 Å in thickness) and a control gate 119. Similarly, a read select transistor 120 is formed with N+ drain region 122 and N+ source region 124 under the same select gate structure 118. The oxide layer 117 and the control gate 119 extend across to the read select transistor so as to form a gate oxide layer 121 and a control gate 123 thereof. A floating gate sense transistor 126 consists of N+ drain region 128 and N+ source region 130, channel region 129, an ion-doped implant region 132 formed in the channel region 129, and a floating gate structure 134. The floating gate structure comprises a gate oxide layer 135 and an N type polycrystalline silicon floating gate (poly-Si) 137.

A tunnel capacitor 136 includes N+ source region 138 and N+ drain region 140, a programmable junction region 142, and a floating gate structure 134. The N+ region forming the drain 140 of the tunnel capacitor 136 is the same as the N+ region forming the source 116 of the write select transistor 112. The floating gate structure 134 comprises a thin tunnel oxide layer 145 (approximately 80 Å in thickness) and a floating gate 147. It is noted that the floating gate 137 extends from the sense transistor 126 so as to form the floating gate 147. The floating gate 137 also extends from the sense transistor 126 to an enlarged area 149 in order to form a gate capacitor.

An N+ programmable junction region 151 is formed under the enlarged area 149. The enlarged area 149 defining the gate capacitance $C_{cg}$ is connected to a control gate line CG. The control gate line CG is capacitively coupled to the gate of the sense transistor 126 via a gate oxide layer 153 of the floating gate structure 134. The floating gate structure 134 is also capacitively coupled to the source 116 of the write select transistor 112 via the tunnel oxide layer 145. A write control line WC is connected to the drain 114 of the write select transistor 112. A product term line PT is connected to the drain 122 of the read select transistor 120, and a product term ground line PTG is connected to the source 130 of the sense transistor 126.

As can best be seen from FIG. 4, a field oxide layer 144 insulates the floating gate 137 from the underlying P-type substrate 146 separating the tunnel capacitor 136 and the sense transistor 126. Further, a field oxide layer 148 insulates the floating gate 137 from the substrate 146 separating the sense transistor 126 and the N+ programmable junction region 151.

Figures 7, 8:
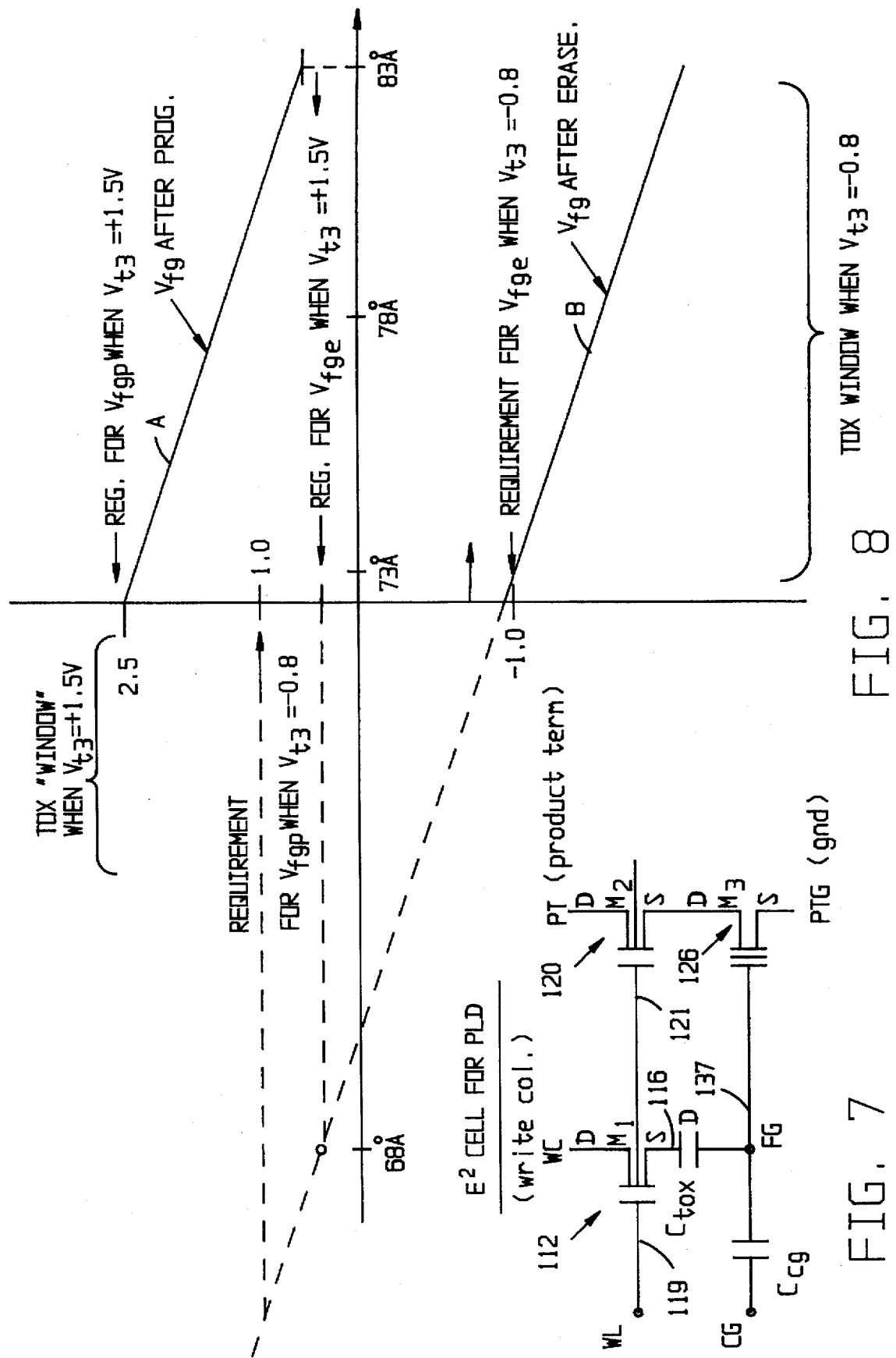
FIG. 7 is a schematic circuit diagram of the present EEPROM structure of FIG. 3.
FIG. 8 is a plot, useful for explaining the criteria for the threshold voltages as a function of the thickness of the tunnel oxide.

In FIG. 7, there is shown a schematic circuit diagram of the EEPROM structure 110 of the present invention. It will be noted that the word line WL is connected to the control gates 119, 121 of the respective write select transistor 112 and the read select transistor 120. The tunnel oxide layer 145 is represented by a capacitor $C_{tox}$ interconnected between the source 116 of the write select transistor 112 and the floating gate 137 (node FG). The gate oxide layer formed between the floating gate 137 and the programmable junction 151 is represented by a capacitor $C_{cg}$ interconnected between the control gate line CG and the node FG. The drain and source electrodes of the write select transistor 112, read select transistor 120 and sense transistor 126 are all designated by legends D and S, respectively. The operation of the EEPROM structure 110 will now be described with reference to FIGS. 3 through 7.

In the Table listed below, there is shown the various voltages applied to the circuit diagram of FIG. 7 in order to effect the three operations of the EEPROM structure 110 which are program (write), erase and read.

TABLE

|  | CG | WL | WC | PT | PTG |
| --- | --- | --- | --- | --- | --- |
| (erase) E: | 13.8$^v$ | 5$^v$ | 0 | float | float (12$^v$) |
| (program) P: | 0$^v$ | 13.8$^v$ | 12$^v$ | float | float |
| (read) R: | 0$^v$ | 5$^v$ | float | 2$^v$ | 0$^v$ |

When the N type poly-Si floating gate 137 is written upon or programmed, the floating gate 137 is given a positive charge by removing (discharging) free electrons from the floating gate. In order to accomplish this, a high programming voltage of approximately +13.8 volts is applied to the word line WL, a first write voltage of approximately +12.0 is applied to the write control line WC, and the control gate line CG is grounded. The product term line PT and the product term ground line PTG are both allowed to float. Thus, the write select transistor 112 will be turned on and the write signal applied to its drain will be coupled to its source. Since the source of the write select transistor 112 is at a high voltage and the control gate line CG is grounded, the high voltage is capacitively coupled to the floating gate 137 (node FG) due to the electric field created between the source and the node FG through the tunnel oxide layer. As a result, electrons will tunnel from the floating gate to the source of the write transistor 112 through the tunnel oxide layer. Thus, a net high positive charge is maintained on the floating gate of the sense transistor 126 and will be turned on during a read operation. This indicates a logic "1" since current can flow through both the read select transistor 120 and the sense transistor 126.

In order to erase the floating gate 137, a high program voltage of approximately +13.8 volts is applied to the control gate line CG, a word line voltage of +5.0 volts is applied to the word line WL, and the write control line WC is grounded. The product term line PT and the product term ground line PTG are again both allowed to float. However, a relatively high voltage of +12 volts may be alternatively applied to the product term ground line PTG in order to effect a faster erase time. Under this biasing condition, the write select transistor 112 will again be turned on, causing the ground potential applied to its drain to be coupled to its source. Since the control gate line CG is now at a high potential and the source of the write select transistor 112 is at the ground potential, the high voltage is capacitively coupled to the floating gate 137 to create a negative electric field between the source and the node FG through the tunnel oxide layer. This causes electrons from the source to tunnel through the tunnel oxide layer, resulting in a net low positive charge on the floating gate.

For reading the state of the sense transistor 126, an operating voltage of +5.0 volts, which is less than the high programming voltage (+13.8 volts) is applied to the word line WL, a read signal of +2.0 volts is applied to the product term line PT, and the write select line WC is allowed to float. The control gate line CG and the product term ground line PTG are both grounded. Under this condition, the read transistor 120 will be turned on. If the floating gate 137 of the sense transistor 126 is charged (erased), the operating voltage will be insufficient to overcome the charge on the floating gate of the sense transistor. Thus, no current will flow which is an indication of a logic "0" since the sense transistor is off. On the other hand, if the floating gate of the sense transistor is discharged (programmed), then the operating potential will be sufficient to overcome the charge on the floating gate of the sense transistor 126. A current will flow between the drain and source of the sense transistor since it is turned on, thereby indicating a logic "1".

If the dopant in the ion-doped implant region 132 is arsenic, the sense transistor 126 will function as a depletion transistor having an intrinsic threshold (with no charge on the floating gate) as $V_{t3}$=−0.8 volts. The potential on the floating gate (after erase) will be $V_{fge}$=−1.0 volts and the potential on the floating gate (after program) will be $V_{fgp}$= +1.0 volts. A plot of the floating gate voltage $V_{fg}$ after programming for the EEPROM structure 110 of the present invention as a function of the tunnel oxide thickness is shown in curve A of FIG. 8. Similarly, a plot of the floating gate voltage $V_{fg}$ after erase for the EEPROM structure 110 as a function of the tunnel oxide thickness is shown in curve B of FIG. 8. Since the floating gate potential $V_{fgp}$ is required to be equal to or greater than +1.0 volts, the upper limit of the oxide thickness must be less than 83 Å. Since the floating gate potential $V_{fge}$ is required to be equal to or greater than −1.0 volts, the lower limit for the oxide thickness must be greater than 73 Å. Thus, the design margin for variations in the tunnel oxide thickness has a window between 73 Å to 83 Å.

If the arsenic dopant in the ion-doped implant region 132 is replaced with a boron implant, the sense transistor 126 will function as an enhancement transistor having an intrinsic threshold of $V_{t3}$=+1.5 volts. The potential on the floating gate (after erase) or $V_{fge}$ will be shifted to +0.5 volts, and the potential on the floating gate (after program) or $V_{fgp}$ will be shifted to +2.5 volts. Accordingly, it can be seen that the upper limit for the oxide thickness is reduced to 73 Å, and the lower limit of the oxide thickness is further reduced to 63 Å. Therefore, the higher electric field can be increased across the oxide by reducing its thickness, which is a natural product of scaling down.

The curve C in FIG. 9 is a plot of the leakage current for a negative threshold $V_{g-}$, and the curve D is a plot of the leakage current for a positive threshold $V_{g+}$. By comparing the curves C and D, it can be seen that the positive threshold has a lower leakage and therefore will retain its programmed data for a longer period of time (higher data retention). In view of this, it is preferable to form the sense transistor 126 in the EEPROM cell 110 as an enhancement transistor. The enhancement transistor will have a longer data retention period because it allows the cell 110 to be operated in a region where the floating gate potential is positive (only positive charges) for both programmed and erased cells.

From the foregoing detailed description, it can thus be seen that the present invention provides an improved EEPROM structure which has a longer data retention period. This is achieved by utilizing only a positive charge in order to store data on the floating gate. The EEPROM structure of the present invention includes a write select transistor, a read select transistor and a floating gate sense transistor. The source of the write select transistor is capacitively coupled to the floating gate of the floating gate sense transistor via a tunnel oxide layer. The floating gate of the sense transistor is also capacitively coupled to a control gate line via gate oxide layer.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A non-volatile memory cell comprising:

a write select transistor (112) having a drain, a source, and a control gate;

a read select transistor (120) having a drain, a source, and a control gate;

a floating gate sense transistor (126) having a drain, a source, and a floating gate;

the drain of said write select transistor being connected to a write control line (WC), the control gate of said write select transistor being connected to the control gate of said read select transistor and to a word line (WL), the source of said write select transistor being capacitively coupled to the floating gate of said floating gate sense transistor via a tunnel oxide layer ($C_{tox}$);

the drain of said read select transistor being connected to a product term line (PT) and the source of said read select transistor being connected to the drain of said floating gate sense transistor;

the floating gate of said floating gate sense transistor being further capacitively coupled to a control gate line (CG) via a gate oxide layer ($C_{cg}$) and the source of said floating gate sense transistor being connected to a product term ground line (PTG); and a high programming voltage being supplied to said word line (WL), a first write select voltage substantially equal to the high programming voltages being applied to said write select line (WC), and a ground potential being applied to the control gate line (CG) during a programming mode so as to discharge the floating gate of said sense transistor.

2. A non-volatile memory cell as claimed in claim 1, wherein said floating gate sense transistor is comprised of a depletion transistor.

3. A non-volatile memory cell as claimed in claim 1, wherein said floating gate sense transistor is comprised of an enhancement transistor.

4. A non-volatile memory cell as claimed in claim 1, wherein said drain and source of said write select transistor is formed of first and second N+ regions.

5. A non-volatile memory cell as claimed in claim 4, wherein said drain and source of said read select transistor is formed of third and fourth N+ regions.

6. A non-volatile memory cell as claimed in claim 5, wherein said drain and source of said sense transistor is formed of fifth and sixth N+ regions, said fifth N+ region forming the drain of said sense transistor being common to the fourth region forming the source of said read select transistor.

7. A non-volatile memory cell as claimed in claim 6, wherein said tunnel oxide layer has a thickness of approximately 80 Å.

8. A non-volatile memory cell as claimed in claim 7, wherein said gate oxide layer has a thickness of approximately 150 Å.

9. A non-volatile memory cell as claimed in claim 1, wherein during an erase mode the high programming voltage is applied to said control gate line (CG), a second write select voltage substantially equal to one-half of the high programming voltages is applied to said word line (WL), and the ground potential is applied to the write control line (WC) so as to charge the floating gate of said sense transistor.

10. An EEPROM structure comprising:

a semiconductor substrate (146) of a first conductivity type having a top surface;

a first drain region (114) of a second conductivity type opposite to said first conductivity type formed on and below said surface of said substrate;

a first source region (116) of the second conductivity type formed on and below said surface of said substrate;

a first channel region (115) disposed between said first drain and first source regions;

a second drain region (122) of the second conductivity type formed on and below said surface of said substrate;

a second source region (124) of the second conductivity type formed on and below said surface of said substrate;

a second channel region (125) disposed between said second drain and second source regions;

a first gate oxide layer (117, 121) formed over said first and second channel regions;

a control gate (119, 123) overlying and insulated from said first and second channel regions, said first drain region, first source region, first channel region, and control gate forming a write select transistor (112), said second drain region, second source region, second channel region, and control gate forming a read select transistor (120);

a third drain region (128) of the second conductivity formed on and below said surface of said substrate, said third drain region also acting as said second source region (124) of said read select transistor;

a third source region (130) of the second conductivity type formed on and below said surface of said substrate;

a third channel region (129) disposed between said third drain and said third source regions;

an ion-doped implant region (132) formed in said third channel region;

a programmable junction region (142) of the second conductivity type formed on and below said surface of said substrate, said programmable junction region also acting as said first source region of said write select transistor;

a tunnel oxide layer (145) formed over said programmable junction region;

a second gate oxide layer (135) formed over said third drain and said third source regions;

a second and larger programmable junction region (151) of the second conductivity type formed on and below said surface of said substrate;

a floating gate (137) formed over and insulated from said third channel region and said tunnel oxide layer, and said second programmable junction region, said third drain region, third source region, third channel region and floating gate forming a floating gate sense transistor (126); and said floating gate, being capacitively coupled to said first source region of said write select transistor via said tunnel oxide layer and being capacitively coupled to a control gate connection (CG) via a third gate oxide layer (153).

11. An EEPROM structure as claimed in claim 10, wherein said ion-doped implant region is doped with arsenic.

12. An EEPROM structure as claimed in claim 10, wherein said ion-doped implant region is doped with boron.

13. An EEPROM structure as claimed in claim 10, wherein said first conductivity type is a P-type.

14. An EEPROM structure as claimed in claim 10, wherein said first conductivity type is an N type.

15. A non-volatile memory cell as claimed in claim 10, wherein said tunnel oxide layer has a thickness of approximately 80 Å.

16. A non-volatile memory cell as claimed in claim 15, wherein said second gate oxide layer has a thickness of approximately 150 Å.

* * * * *